(12) United States Patent
Kawamura et al.

(10) Patent No.: US 6,540,537 B1
(45) Date of Patent: Apr. 1, 2003

(54) IC SOCKET WITH TWO POINT-CONTACTS

(75) Inventors: Nobuo Kawamura, Sakura (JP); Takao Iimura, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/023,691

(22) Filed: Dec. 21, 2001

(30) Foreign Application Priority Data

Dec. 26, 2000 (JP) ........................................ 2000-396148

(51) Int. Cl.[7] .............................................. H01R 11/22
(52) U.S. Cl. ...................................................... 439/266
(58) Field of Search ................................. 439/266, 267, 439/70–73, 330, 331, 268

(56) References Cited

U.S. PATENT DOCUMENTS

| | | | | |
|---|---|---|---|---|
| 5,443,396 A | * | 8/1995 | Tokushige | 439/266 |
| 5,713,751 A | * | 2/1998 | Fukunaga | 439/266 |
| 6,109,944 A | * | 8/2000 | Takeyama | 439/266 |
| 6,213,803 B1 | * | 4/2001 | Kato et al. | 439/266 |
| 6,296,503 B1 | * | 10/2001 | Shimada | 439/266 |
| 6,354,856 B1 | * | 3/2002 | Shimada | 439/266 |

* cited by examiner

Primary Examiner—Gary Paumen
(74) Attorney, Agent, or Firm—Finnegan, Henderson, Farabow, Garrett & Dunner, LLP

(57) ABSTRACT

The present invention provides an IC socket with two point-contacts which restricts the tracks of contacts contacting with a lead terminal of an IC package. The IC socket with two point-contacts has a pair of contact portions that move forward and backward in response to the vertical movement of a cover. When the pair of contact portions move forward, a lead terminal of an IC package is sandwiched between the pair of contact portions, which have their movement restricted by a contact track cam and contact with the lead terminal under uniform contact force without abutting against an end of the lead terminal or deforming the lead terminal.

4 Claims, 4 Drawing Sheets

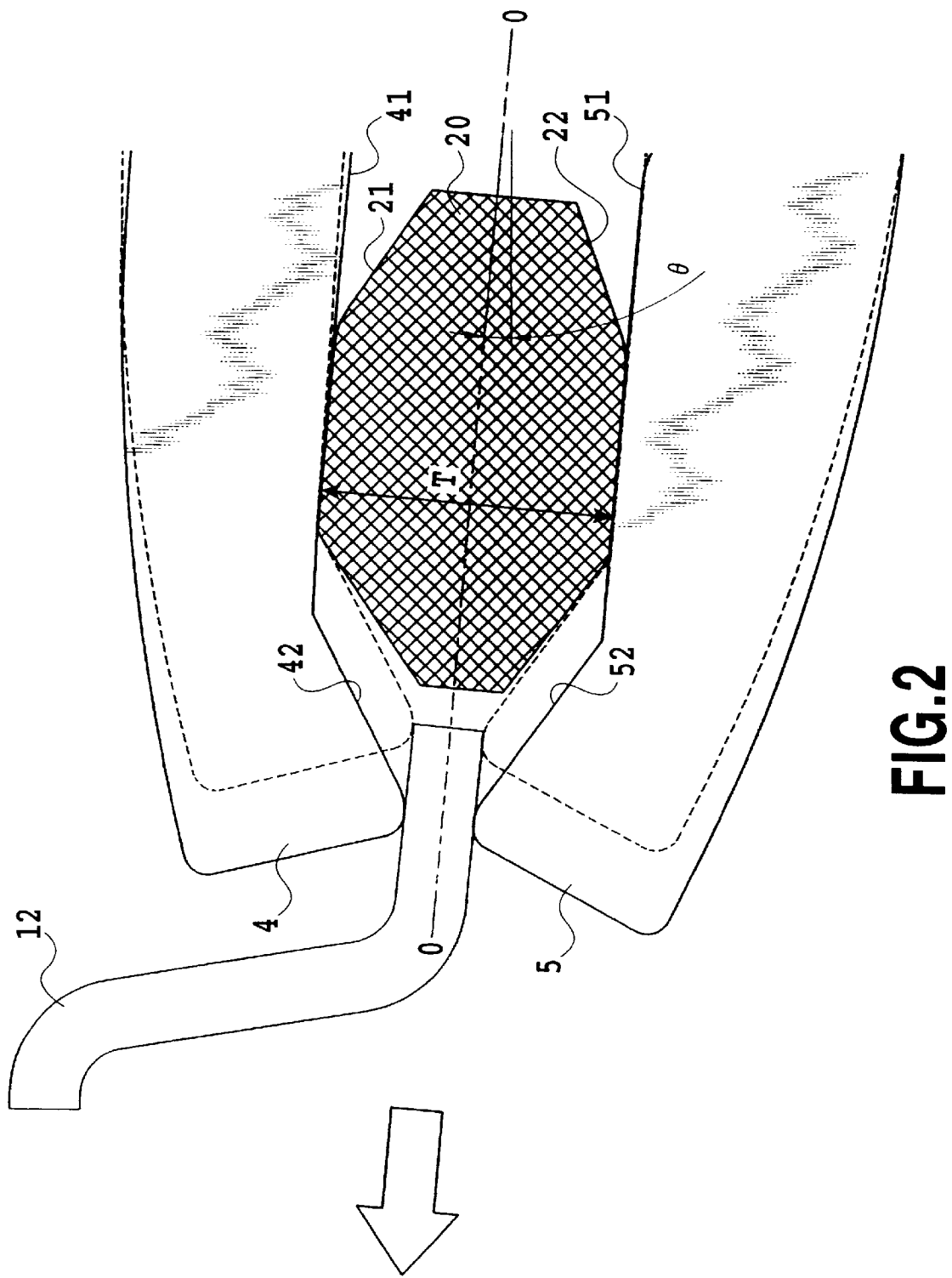

IC SOCKET WITH TWO POINT-CONTACTS

This application is based on Patent Application No. 2000-396148 filed Dec. 26, 2000 in Japan, the content of which is incorporated hereinto by reference.

BACKGROUND OF THE INVENTION

1. Field of the Invention

The present invention relates to an IC socket with two point-contacts, and more specifically, to an IC socket with two point-contacts which restrict the tracks of contacts that may contact with a lead terminal of an IC package to prevent the lead terminal from being deformed.

2. Description of the Related Art

IC sockets with two point-contacts have been commonly used because of their capability of reliably measuring the characteristics of IC packages at a high speed. An IC socket with two point-contacts and the operation of installing a IC package on an IC socket will be described in brief with reference to FIG. 3.

FIG. 3A shows a socket free state in which no IC package is installed on an IC socket. In this figure, the IC socket 1 is composed of a contact 2, a base 8, a platform 7, and a cover 9. The contact 2 is composed of a pair of contact portions 4 and 5 that sandwich a lead terminal 12 of an IC package 11, a pressure receiving section 3 that engages with a contact opening cam 10 of the cover 9 to move the pair of contact portions 4 and 5, and a terminal portion 6 that projects downward from the base 8. A large number of elastic contacts 2 are arranged on the base 8 in a direction perpendicular to the sheet of the drawing. The IC package 11 is placed on the platform 7. Further, the cover 9 is urged and biased upward by a coil spring (not shown).

To install the package 11 on the IC socket 1 constructed as described above, the cover 9 is first subjected to a pressure corresponding to a full stroke, as shown in FIG. 3B. The pressure receiving section 3 of the contact 2 engages with contact opening cam 10 of the cover 9 and moves along the opening cam 10. Thereby the contact portions 4 and 5 of the contact 2 also move backward (right side contact moves rightward in the drawing).

Then, the IC package 11 is placed on the platform 7, and the cover 9 is subsequently released. Then, the pair of contact portions 4 and 5 of the contact 2 move forward or return to their original portions, while the lead terminal 12 of the IC package 11 placed on the platform 7 is sandwiched between the contact portions 4 and 5 (see FIG. 3C).

After the IC package 11 has been tested, the cover 9 is subjected to a pressure corresponding to a full stroke to move the contact portions 4 and 5 backward, while the lead terminal 12 is released from the contact portions 4 and 5 to allow the IC package 11 to be removed from the IC socket 1.

When the lead terminal 12 of the IC package 11 is sandwiched between the pair of contact portions 4 and 5, the motion of the contact portions 4 and 5 is controlled by the shape of the contact opening cam 10 provided on the cover 9. However, although the above described IC socket with two point-contacts is characterized by allowing the characteristics of the IC package to be reliably measured at a high speed, good electric contact is not always achieved partly owing to the shape of the lead terminal 12 and regardless of the shape of the contact opening cam 10.

This will be described with reference to FIG. 4. In this figure, the pair of contact portions 4 and 5 sandwich the lead terminal 12 therebetween while moving in the direction shown by the arrow in the figure. At this time, depending on the shape of the lead terminal 12, the lower contact portion 5, which comes in contact with the lead terminal 12 from below, abuts against an end of the lead terminal 12 to deform the lead terminal 12 (see the parts of the figure shown by the solid lines). This results in bad contact or in the worst case, hinders the lead terminal 12 from being sandwiched therebetween. Further, even if the lead terminal 12 is successfully sandwiched between the contact portions 4 and 5, it is pressed by the upper contact portion 4, which comes in contact with the lead terminal 12 from above, and is thus deformed downward (see the parts of the figure shown by the dot lines), depending on its shape. In some cases, the lower contact portion 5 cannot come in contact with the lead terminal 12.

It is an object of the present invention to provide an IC socket constituted to restrict the tracks of the pair of contact portions, while allowing the pair of contact portions to contact with the lead terminal under a uniform pressure.

SUMMARY OF THE INVENTION

An IC socket with two point-contacts according to the present invention is characterized by comprising contacts each having a pair of contact portions that sandwich a lead terminal of an IC package therebetween and that are urged and biased by elastic force in a direction in which the contact portions sandwich the lead terminal therebetween, and a contact track restricting means arranged between each pair of contact portions to restrict motion thereof.

Further, the IC socket with two point-contacts according to the present invention is characterized in that the contact track restricting means comprise at least a parallel portion, and the pair of contact portions each comprise an inclined surface on an inner side of a neighborhood of a tip thereof.

Furthermore, the IC socket with two point-contacts according to the present invention may further comprise a cover so that in response to vertical movement of the cover, the pair of contact portions of each contact move forward and backward along the contact track restricting means relative to the lead terminal of the IC package.

The above and other objects, effects, features and advantages of the present invention will become more apparent from the following description of embodiments thereof taken in conjunction with the accompanying drawings.

BRIEF DESCRIPTION OF THE DRAWINGS

FIG. 2 is an enlarged view of an essential part of the present invention, showing that a pair of contact portions of a contact sandwiches a lead terminal of a package therebetween;

DESCRIPTION OF THE PREFERRED EMBODIMENT

Figure 1:
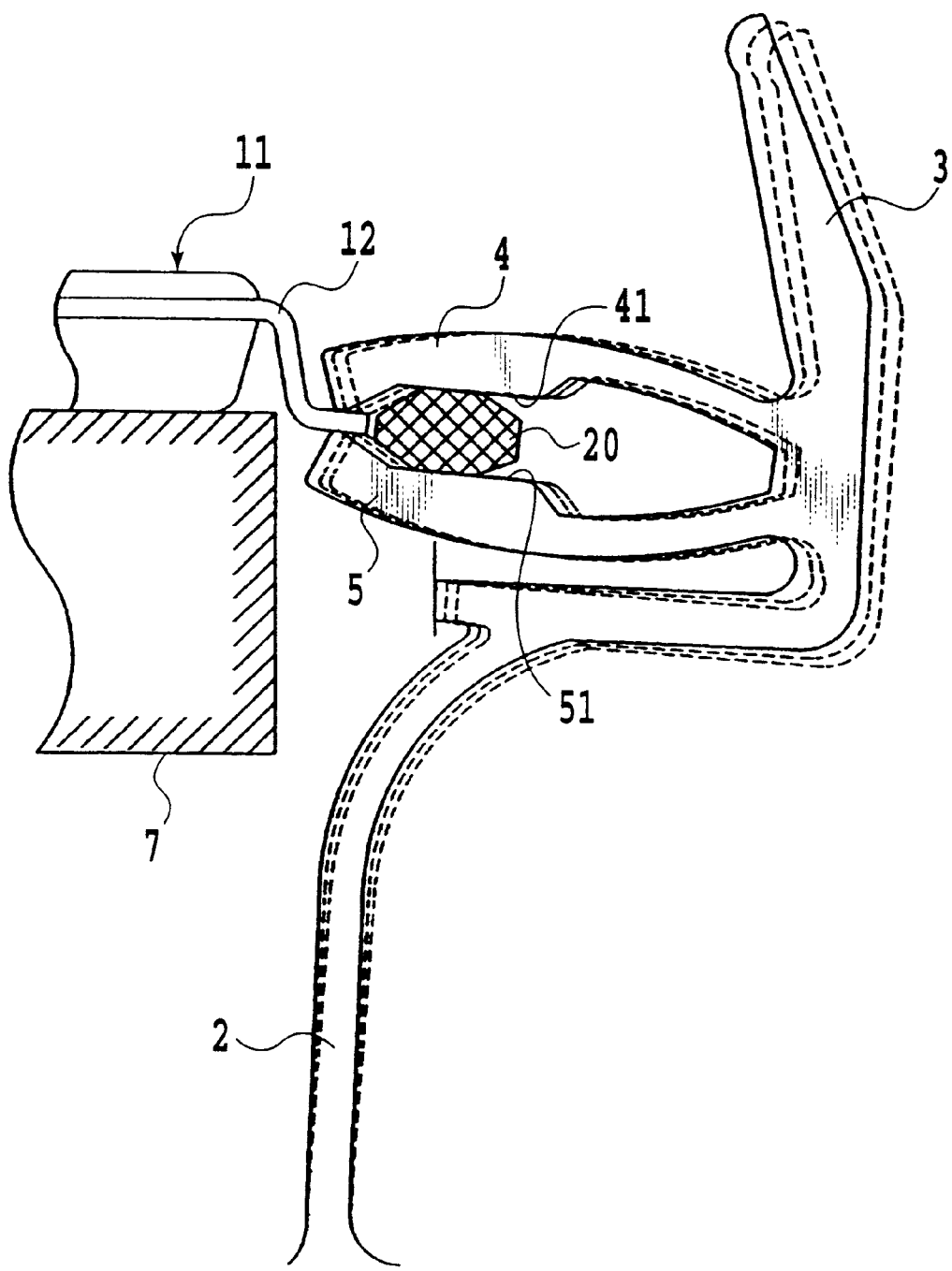
FIG. 1 is a view showing an essential part of IC socket comprising a contact and a contact track restricting means according to the present invention.

FIG. 1 is a view showing an essential part of IC socket comprising a contact and a contact track restricting means according to the present invention.

FIG. 2 is an enlarged view of an essential part of the contact of the present invention, showing that a pair of contact portions of a contact sandwiches a lead terminal of a package therebetween.

Figure 3A:
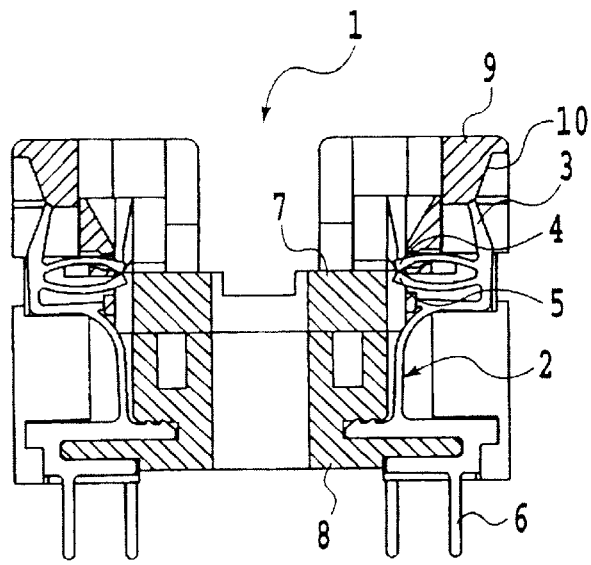
FIG. 3A is a view showing a socket free state of a conventional IC socket with two point-contacts.
Figure 3B:
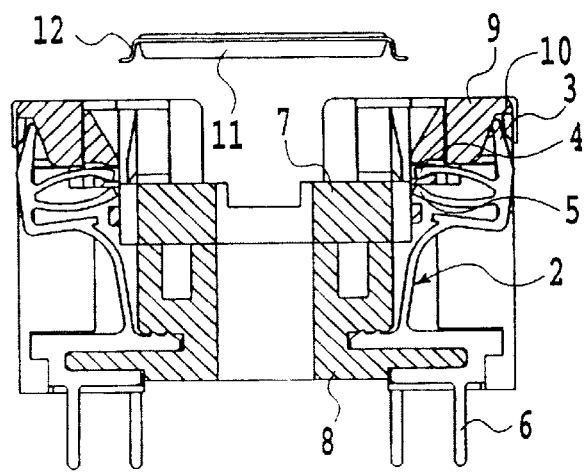
FIG. 3B is a view showing a socket full-stroke state of the conventional IC socket with two point-contacts.
Figure 3C:
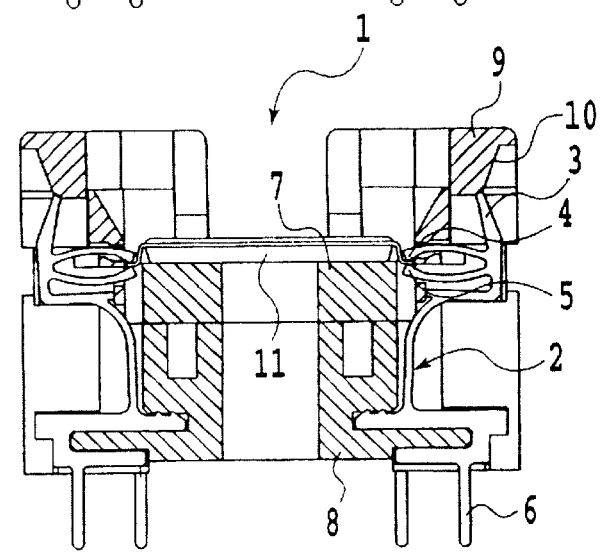
FIG. 3C is a view showing the socket free state of the conventional IC socket with two point-contacts, in which a contact is in contact with a lead terminal of a package.
Figure 4:
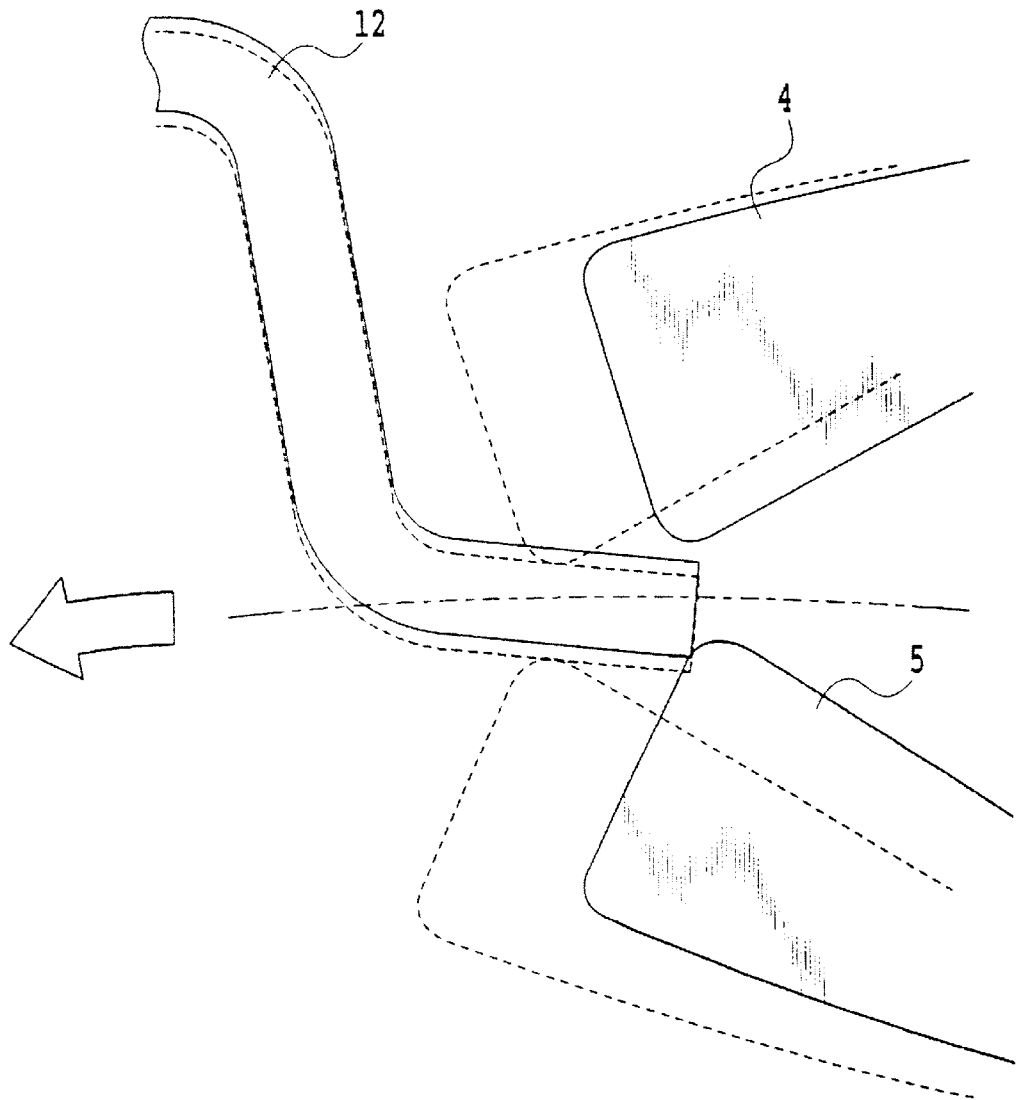
FIG. 4 is a detailed view of FIG. 3 showing that the contact comes in contact with the lead terminal.

In FIG. 1, a contact 2 comprises a pressure receiving section 3 that engages with a contact opening cam of a cover 9, and a pair of contact portions 4 and 5. A contact track cam 20 as a contact track restricting means is provided between the pair of contact portions 4 and 5. The other parts of the construction of the IC socket are similar to those shown in FIG. 3 and are thus omitted from this figure.

In FIGS. 1 and 2, the solid lines denote a socket free state (that is, the pair of contact portions 4 and 5 are completely in contact with a lead terminal 12). The dot lines in these figures denote the state in which the pair of contact portions 4 and 5 come in contact with the lead terminal (FIG. 2 shows only an initial contact state).

As shown in detail in FIG. 2, the contact track cam 20 is line-symmetrical in section and has cam surfaces 21 and 22 each shaped generally like a trapezoid. Each of the cam surfaces 21 and 22 has two inclined portions and a portion parallel with a centerline O—O. The centerline O—O is arranged so as to substantially linearly join to the lead terminal 12 at substantially the same angle as the inclination θ of an end of the lead terminal 12 of an IC package 11. It should be appreciated that the contact track cam 20 is disposed so as to traverse all of the large number of contacts arranged in a direction perpendicular to the sheet of the drawing.

On the other hand, the pair of contact portions 4 and 5 have cam contact surfaces 41 and 51, respectively, formed on inner sides thereof and which are parallel with each other. The cam surfaces 41 and 51 contact with the parallel portions of the cam surfaces 21 and 22, respectively, of the contact track cam 20 to restrict the tracks of the contact portions when the contact portions sandwich the lead terminal 12 of the IC package 11.

In this case, the pair of contact portions 4 and 5 are preferably designed to have an appropriate interval between the cam contact surfaces 41 and 51 of the pair of contact portions 4 and 5 relative to the thickness T of the parallel portions of the contact track cam 20 so that the contact portions 4 and 5 are urged and biased to the contact track cam 20. Here, it is preferred to make a distance between the cam contact surfaces 41 and 51 smaller than the thickness T of the contact track cam 20 and to set the distance within the range of 1 to 4 times of a thickness (diameter) of the lead terminal 12 of the IC package 11. Accordingly, the tips of the pair of contact portions 4 and 5 of the contact 2 achieve to sandwich the lead terminal 12 with suitable pressure.

Furthermore, in the vicinity of the tips of the pair of contact portions 4 and 5, the cam contact surfaces 41 and 51, which contact the cam surfaces 21 and 22, respectively, of the contact track cam 20, are formed into inclined surfaces 42 and 52, respectively, each having a predetermined angle (preferably, each having an angle smaller than that of the inclined portion of the cam surface, i.e. having gentle incline). When the inclined surfaces 42 and 52 come in contact with the cam surfaces 21 and 22 of the contact track cam 20 during a socket full stroke operation, the pair of contact portions 4 and 5 move backward relative to the initial contact state shown in FIG. 2. The tips of the pair of contact portions 4 and 5 are thereby opened for a distance larger than the diameter of the lead terminal 12 (not shown).

An explanation will be given of the operation of allowing the pair of contact portions 4 and 5 to sandwich the lead terminal 12 of the package 11 therebetween according to the present invention.

As described above, in response to a socket full-stroke operation, the pair of contact portions 4 and 5 move rightward (in the direction opposite to that shown by the arrow) relative to the initial contact state shown by the dot line in the figure. And the tips of the pair of contact portions 4 and 5 are opened so as to form an interval larger than the diameter of the lead terminal 12 of the IC socket 11. When the IC socket 11 is placed on a platform 7, the cover 9 is released. Thus, the pair of contact portions 4 and 5 move forward in the direction shown by the arrow, and the tips of the contact portions 4 and 5 are gradually closed.

Then, in the position of the initial contact state shown by the dot lines, the tips of the pair of contact portions 4 and 5 come in contact with the lead terminal 12 of the IC package 11 from above and below to sandwich the lead terminal 12 therebetween under predetermined force and under restrictions from the contact track cam 20 without abutting against the end of the lead terminal 12. At the same time, the cam contact surfaces 41 and 51 of the pair of contact portions 4 and 5 start to move along the parallel portions of the contact track cam 20. Thus, the tips of the pair of contact portions 4 and 5 move in parallel while in contact with the lead terminal under uniform contact force, and stop in the complete contact state (that is, the socket free state) shown by the solid lines in the figure.

In this manner, the lead terminal 12 of the IC package 11 is sandwiched between the contact portions 4 and 5 via the contact track cam 20. Thereby it is possible to avoid the state in which one of the contact portions fails to contact with the lead terminal or the contact portions contact therewith incompletely. Consequently, a uniform stable contact is achieved.

In the description of the embodiment of the present invention, the contact portions 4 and 5 comprise the parallel cam contact surfaces 41 and 51, and the cam 20 comprises the cam surfaces 21 and 22 having the parallel surfaces. However, the present invention is not limited to this embodiment. It will be appreciated that the shapes of the contact portions and the contact track cam have only to be designed so that the lead terminal is sandwiched between the contact portions under predetermined force.

As described above, in the present invention, the contact track restricting means is provided between the two contact portions of the two point-contacts, thereby preventing the tips of the contact portions from abutting against the lead terminal as in the prior art and enabling a stable contacting operation under uniform contact force to the proper contact position.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. An IC socket with two point-contacts comprising:
   a plurality of contacts each having a pair of contact portions that sandwich a lead terminal of an IC package therebetween and that are urged and biased by elastic force in a direction in which the contact portions sandwich the lead terminal therebetween; and
   a contact track restricting means arranged between each of said plural pairs of contact portions to restrict motion thereof in a direction in which the contact portions are opened or closed.

2. The IC socket with two point-contacts as claimed in claim 1, wherein said contact track restricting means comprise at least a parallel portion.

3. The IC socket with two point-contacts as claimed in claim 2, wherein said pair of contact portions each comprise an inclined surface on an inner side of a neighborhood of a tip thereof.

4. The IC socket with two point-contacts as claimed in claim 3, wherein the IC socket with two point-contacts further comprises a cover so that in response to vertical movement of said cover, the pair of contact portions of each of the contacts move forward and backward along said contact track restricting means relative to the lead terminal of said IC package.

* * * * *